United States Patent
Toda et al.

(10) Patent No.: US 9,698,776 B2
(45) Date of Patent: Jul. 4, 2017

(54) ULTRASONIC AND STRAIN DUAL MODE SENSOR FOR CONTACT SWITCH

(71) Applicant: Measurement Specialties, Inc., Hampton, VA (US)

(72) Inventors: Minoru Toda, Lawrenceville, NJ (US); Kyung Tae Park, Berwyn, PA (US)

(73) Assignee: Measurement Specialties, Inc., Hampton, VA (US)

( * ) Notice: Subject to any disclaimer, the term of this patent is extended or adjusted under 35 U.S.C. 154(b) by 0 days.

(21) Appl. No.: 14/639,964

(22) Filed: Mar. 5, 2015

(65) Prior Publication Data

US 2015/0253935 A1     Sep. 10, 2015

Related U.S. Application Data

(60) Provisional application No. 61/948,312, filed on Mar. 5, 2014.

(51) Int. Cl.
   *G06F 3/043* (2006.01)
   *H03K 17/96* (2006.01)

(52) U.S. Cl.
   CPC . *H03K 17/964* (2013.01); *H03K 2217/96007* (2013.01)

(58) Field of Classification Search
   CPC .................. H03K 17/964; H03K 2217/96007
   USPC ......................................................... 345/174
   See application file for complete search history.

(56) References Cited

U.S. PATENT DOCUMENTS

| | | | |
|---|---|---|---|
| 4,896,069 A | 1/1990 | Rosenberg et al. | |
| 5,673,041 A * | 9/1997 | Chatigny | H03K 17/94 178/18.04 |
| 6,064,141 A | 5/2000 | Wiciel | |
| 6,099,479 A * | 8/2000 | Christopherson | A61N 1/3601 600/529 |
| 8,941,624 B2 | 1/2015 | Kent et al. | |

(Continued)

OTHER PUBLICATIONS

International Search Report dated Jun. 11, 2015 for related application PCT/US2015/019077.

*Primary Examiner* — Andrew Sasinowski
*Assistant Examiner* — Chineyere Wills-Burns
(74) *Attorney, Agent, or Firm* — Howard IP Law Group

(57) ABSTRACT

A system and method for ultrasonic touch switch combined with piezoelectric touch mode is described. The sensor structure may be embodied as a substrate with a piezoelectric element at the back surface of the substrate, with the front surface being a touch sensitive surface. Both operational modes are possible by use of the same sensor element with filtering of the signals so that different advantages of two modes are combined, while disadvantages of either mode are mitigated. The tolerance of substrate thickness of ultrasonic touch mode is improved by use of a wide range of frequency deviation of drive signal by filtering out the fundamental modulation frequency from the output signal and wherein only sharp pulses corresponding to abrupt impedance changes of the piezoelectric element are extracted. The amplitude of the sharp pulses decreases with touching the front surface of substrate. At the same time pressure force applied to the front surface causes the substrate to undergo bending displacement and causes piezoelectric element expansion strain to generate voltage. These two modes are combined and used to control switch of appliance or equipment.

17 Claims, 10 Drawing Sheets

(56) References Cited

U.S. PATENT DOCUMENTS

| | | |
|---|---|---|
| 2002/0049464 A1 | 4/2002 | Donofrio et al. |
| 2005/0275567 A1* | 12/2005 | DePue .................. H03K 17/94 341/32 |
| 2007/0119698 A1* | 5/2007 | Day ........................ G06F 3/038 200/510 |
| 2011/0141052 A1* | 6/2011 | Bernstein ................ G06F 3/016 345/174 |
| 2013/0060140 A1 | 3/2013 | Sinelnikov |

* cited by examiner

Combinations of signals from terminals A-D relating to failure types I-VI

| | I low piezoelectricity | II delaminated | III open | IV short | V concave deformation | VI contamination |
|---|---|---|---|---|---|---|
| A ultrasonic mode | X Very weak signal | X no signal | X no signal | X no signal | Normal | X steadily signal out |
| A' touch duration sensing, limit is set | N/A | N/A | N/A | N/A | Normal | X too long time signal exceed limit |
| B capacitance check by voltage | Normal | Normal | X too high voltage | X no voltage | Normal | Normal |
| C capacitive heat signal | X weak signal | Normal | X no signal | X no signal | Normal | Normal |
| D strain mode | X weak signal | X no signal | X no signal | X no signal | X lower signal | Normal |

*Fig. 9*

ULTRASONIC AND STRAIN DUAL MODE SENSOR FOR CONTACT SWITCH

CROSS-REFERENCE TO RELATED APPLICATIONS

This application claims priority to, and benefit under 35 U.S.C. §119(e) of, U.S. Provisional Application No. 61/948,312 entitled "Ultrasonic and Strain Dual Mode Sensor For Contact Switch", filed on Mar. 5, 2014, the entire disclosure of which is hereby incorporated by reference for all purposes as if being set forth in its entirety herein.

FIELD OF THE INVENTION

The present invention relates generally to touch sensitive devices, and more particularly, to an ultrasonic contact sensor or finger pressure sensor.

BACKGROUND

A finger touch switch is an important input device for various types of electronic equipment, including but not limited to computer keyboards, microwave ovens, copier machines, electronic card readers, ATM machines, and the like. Basic sensing mechanisms for identifying the pressed (depressed) point or location typically include metal to metal contact, capacitive or conductive variations of transparent electrodes, magnetic field detection, optical intercept, piezoelectric strain effect, and so on. In order to detect small deformations at the pressed points, one or more thin layers or membranes, or flexible insulators are often utilized. However, such structures often experience wear or fatigue problems, and/or are vulnerable to vandalism.

Examples of such finger touch switch devices known in the art include reflective mode ultrasonic touch switch devices as described in U.S. Pat. No. 5,673,041, assigned to Measurement Specialties, Inc., and incorporated herein by reference in its entirety. Such devices are based on resonance of a substrate (typically composed of low loss material such as glass or metal), and a piezoelectric element at the back surface of the substrate which detects the resonance. The resonance forms very sharp peaks at integer multiples of half wavelength thickness conditions of the substrate. This resonance is damped by contact at the substrate's front surface by a finger which is detected by the piezoelectric element.

Another type of touch switch known in the art (piezo touch switch) is illustrated in U.S. Pat. Nos. 4,896,069 and 6,064,141. This type of touch switch is based on a different mechanism than the ultrasonic touch switch described above. In this case, bending strain of a housing plate (sensor plate) by a pressure force is detected by a piezoelectric element bonded at the back of the plate and used to control switching of electric appliances. Disadvantages of such piezoelectric touch switches include their lack of sensitivity for steady contact force or very low sensitivity for slowly increasing or decreasing force, as well as their undesirably high sensitivity to external vibration or mechanical shock.

On the other hand, reflective mode ultrasonic touch switches or sensors have little or no sensitivity to external vibration or mechanical shock. Further, ultrasonic touch sensors exhibit sensitivity to steady contact, and when contact force increases beyond a given point or threshold, the switch starts to work (i.e. is activated). However, during operation of ultrasonic touch switches, particularly in applications such as for use in kitchen appliances, surface contamination (whereby a contaminant such as butter, ketchup, oils, greases, or even pure water etc. on the finger adheres to the sensing area) has the same effect as a steady touch of a finger, and can thereby yield a false signal.

Other disadvantages of the ultrasonic reflective mode touch switch includes its less than desirable (i.e. low) sensitivity to a gloved finger or soft cloth, while for a piezoelectric touch switch, this type of device exhibits essentially the same sensitivity to pressure force, with its sensitivity essentially independent of the material which covers the finger.

Further shortcomings associated with conventional sensors (ultrasonic or bending strain type) include their difficulty in providing, or the complete absence of, self diagnosis functions.

Alternative systems and methods are desired.

SUMMARY

An embodiment of the present invention relates to an apparatus that combines the advantageous features of both an ultrasonic touch switch and piezoelectric touch switch utilizing a same sensor element, and wherein two kinds of signals output from both modes are separately detected by filters and amplifiers. In this way, a steady touch force is detected in an ultrasonic mode, and contamination problems associated with the sensor (e.g. due to the presence of contaminating matter on the finger applied to the sensor) is mitigated in a piezoelectric strain mode. Further, the apparatus is configured to detect when the finger is covered by cloth, while also maintaining its insensitivity to external vibration or mechanical shock.

A system and method for an ultrasonic touch switch combined with a piezoelectric strain mode sensor is disclosed. The sensor structure may be embodied as a substrate with a piezoelectric element at the back surface of the substrate, with the front surface being a touch sensitive surface. Both operational modes are implemented by use of the same sensor element with filtering of the signals so that different advantages of the two modes are combined, while disadvantages of either mode are mitigated. The tolerance of substrate thickness of ultrasonic touch mode is improved by use of a wide range of frequency modulation of the drive signal (FM) by filtering out the fundamental modulation frequency from the output signal whereby only sharp pulses corresponding to abrupt impedance changes of the piezoelectric element are extracted. The amplitude of the sharp pulses decreases with touching of the front surface of the substrate. At the same time the pressure force applied to the front surface causes the substrate to undergo bending displacement and causes piezoelectric element expansion strain to generate a voltage. These two modes are combined and used to control switching of an appliance or equipment.

In an embodiment, a system and method is disclosed for an ultrasonic touch switch having a substrate with a piezoelectric element at the back surface of the substrate, with the front surface being a touch sensitive surface. The tolerance of the substrate thickness of the ultrasonic touch switch is improved by use of a wide range of frequency deviation of a drive signal and filtering out a fundamental modulation frequency from the output signal such that only sharp pulses corresponding to abrupt impedance changes of the piezoelectric element are extracted. The system filters high frequency components for passage to a decision circuit. The amplitude of the sharp pulses decreases with touching the front surface of the substrate. In this manner, contact by the finger to the surface of the substrate is detected by reduction of the peaks and a switching signal operation is generated to control a switching of an appliance or equipment In a practical environment having relatively high levels of vibration and mechanical shock, the design may be modified to reduce the sensitivity of a piezoelectric strain mode, and in the case where a glove (on the hand) is used, the sensitivity of the piezoelectric strain mode is often enhanced.

According to an aspect of the present invention, ultrasonic impedance variation at resonance is detected by a piezoelectric element at the back surface of the substrate. The resonance takes place in the substrate material when the thickness becomes equal to an integer multiple of half wavelength condition and wherein the impedance of piezoelectric material changes abruptly at the resonance frequency (e.g. at about ~5 MHz for 0.5 mm stainless steel). The resonance frequency is determined by the substrate thickness. The thickness has some variation depending on production tolerances of the substrate material. To detect this impedance variation at certain different frequencies for different thickness, the frequency of excitation signal is frequency modulated over a relatively wide range (FM, e.g. over about ~500 kHz range). An abrupt change of impedance is detected by the amplitude difference of the voltage on the piezoelectric element which converts the FM signal to an amplitude modulated (AM) signal. The modulation frequency of FM is ~1 kHz for example, and the abrupt change of impedance generates a sharp variation of the AM signal. The system is configured to detect the amplitude of the AM signal and the sharp variation is manifest as a sharp pulse or spike. After removing the modulation frequency component (~1 kHz), the signal contains only sharp pulses and utilized for detection of touch or non-touch of the substrate surface. In this system, a feature of design is the wide tolerance of the substrate thickness.

The structure of the ultrasonic touch switch includes the substrate with a piezoelectric element at the back surface and wherein the front surface is adapted to be touched by a finger. The same structure is used as a piezoelectric strain switch in which the pressure force from the front surface slightly bends the substrate and provides planar expansion strain to the piezoelectric sensor. The excitation signal of FM for the ultrasonic mode may be removed by filtering and the signal from only the pressure force may be extracted as an electrical signal, such that the response signal of the piezoelectric strain sensor is not influenced by the excitation voltage of the ultrasonic mode.

Self diagnosis of the sensor operation may be accomplished using the combination of effects in a single piezoelectric element. Those effects include the ultrasonic touch effect, piezoelectric strain effect, and capacitance check. In the latter case, the capacitance of the piezoelectric element is determined and used for self diagnosis according to its determined capacitance value. In another aspect, thermal energy in the form of heat from the finger impinging upon the contact area influences the temperature of the piezoelectric element, thereby leading to a change of capacitance. Such capacitance change causes generation of a signal similar to the piezoelectric strain effect caused by finger touching.

BRIEF DESCRIPTIONS OF DRAWINGS

FIG. 9 is a table showing exemplary conditions and processing logic based on output signals from the detection system according to embodiments of the present invention.

DETAILED DESCRIPTION

Reference will now be made in detail to the present exemplary embodiments of the invention, examples of which are illustrated in the accompanying drawings.

Figure 1:
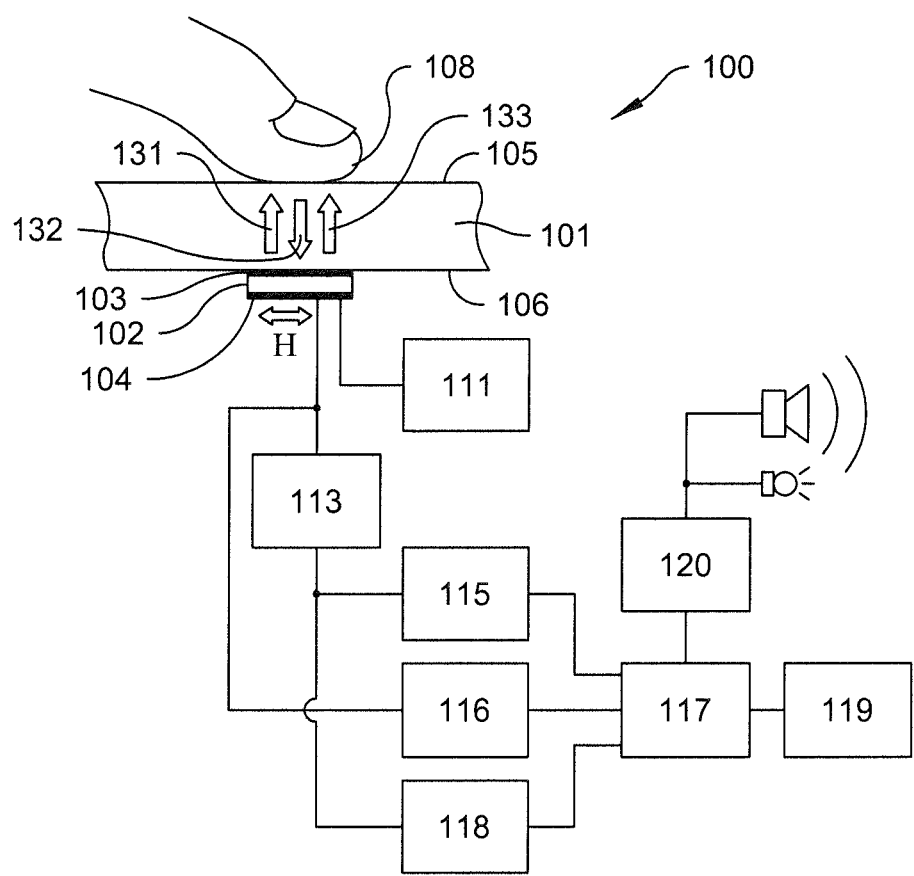
FIG. 1 shows a schematic diagram of a dual mode ultrasonic reflective mode and piezoelectric strain switch device according to an embodiment of the invention.

FIG. 1 shows a cross section view of a device 100 configured as a dual mode ultrasonic touch switch combined with piezoelectric strain switch device according to an embodiment of the invention. A piezoelectric element 102, preferably a piezoelectric polymer material such as polyvinylidene fluoride (PVDF) or polyvinylidene fluoride-trifluoroethylene (PVDF-TrFE) in film form, or piezoelectric ceramic (PZT), has electrodes 103, 104 disposed on opposing (top and bottom) surfaces of element 102. A substrate 101 which may be formed, for example, of stainless steel or glass, has first and second opposed parallel surfaces 105 and 106. On the first surface 105 of the substrate 101 there is a defined touch region, preferably of a size approximately equal to the contact area of an operator's finger 108. The top electrode 103 is bonded to the back surface 106 of the substrate 101 opposite from the touch region. By way of example only, the touch region can be defined as part of a computer generated display, wherein the substrate 101, the piezoelectric element 102 and the electrodes (103, 104) may be relatively transparent, or the touch region can be defined by indicia on the front surface 105.

A controller or generator 111 excites piezoelectric element 102 and an ultrasonic wave 131 is launched into substrate 101. The wave is reflected (132) at front surface 105 with an absorption by finger skin 108 back to surface 106 and reflected again (133) to the front direction, as represented by the three vertically oriented directional arrows. The wave propagates back and forth across the substrate. When the thickness is equal to an integer multiple of half wavelength condition of the substrate 101, resonance of substrate 101 takes place. When a finger is not present on front surface 105 (i.e. where there is nothing touched at front surface 105 so that there is an air boundary for the no finger touch condition), the resonance is strong and gives strong influence to impedance variation to piezoelectric element 102. Impedance variation by contact of the finger or any other absorbing matter 108 is detected by detector circuit 113 and 115.

When an operator's finger engages the touch region, the finger applies a pressure force and the substrate 101 is pressed downwards. Under these conditions, strain is maximum at the location underneath finger 108. In response, piezoelectric element 102 expands in the planar direction (represented as horizontal arrow H) and generates a voltage which is processed by circuit 116. The signal from piezoelectric element 102 may be input to low frequency strain detection circuit 116 for determining piezoelectric strain of low frequency signal components. At the same time the impedance change of piezoelectric layer 102 creates voltage change of electrode 114 with frequency scanning (or modulation) of generator 111 and is fed to peak detector 113 that operates to perform peak detection of signal amplitude variations. The processed signal is applied to downstream detector circuit with AGC 115 (ultrasonic or high frequency signal detection). The signals output from detector circuits 115 and 116 are fed to decision circuit 117 which discriminates between meaningless noise and a finger touch, and provides an output to switch 119 which controls the state of an appliance or equipment device (not shown).

In one embodiment, in the event decision circuit 117 fails to provide a sufficient output signal to switch 119 by (for example, due to a very small touch force applied to the sensitive area, a low applied force that increases too slowly, a glove or soft cloth over the depressing finger, or contamination of the sensing area, etc.) an indicator 120 is activated to output an alert signal (e.g. a visible illuminator and/or audible warning signal) to the user/system operator.

The output from peak detector circuit 113 is also applied to capacitive detector circuit 118 which detects the level of capacitance of piezoelectric element 102 for purposes of self diagnosis. The capacitance value is monitored by the high frequency amplitude which is sensed by the DC output value from peak detector 113. The peak detector output is proportional to the high frequency signal amplitude. The capacitance value itself is detected by circuit 118 and utilized as self diagnosis. When a finger touches the surface 105, the heat from the finger is transmitted to piezoelectric element 102 which gives variation of capacitance. This change or variation is detected by circuit 118 to be used as self diagnosis, together with ultrasonic signal output from circuit 115, and piezoelectric strain signal output from circuit 116. Decision circuit 117 receives and processes these inputs and provides a warning signal through indicator control 120 in the event the inputs are not within threshold or calibrated/expected values.

Figure 4:
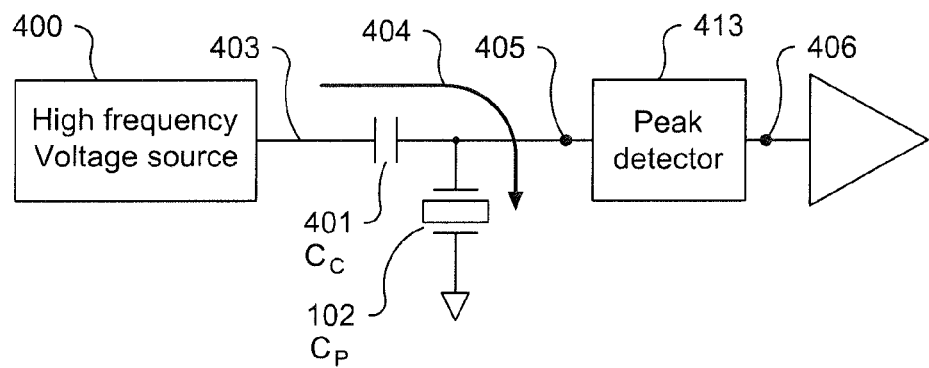
FIG. 4 shows a more detailed schematic diagram of a portion of the device shown in FIG. 1 illustrating the capacitive effect of the device according to an embodiment of the invention.
Figure 7:
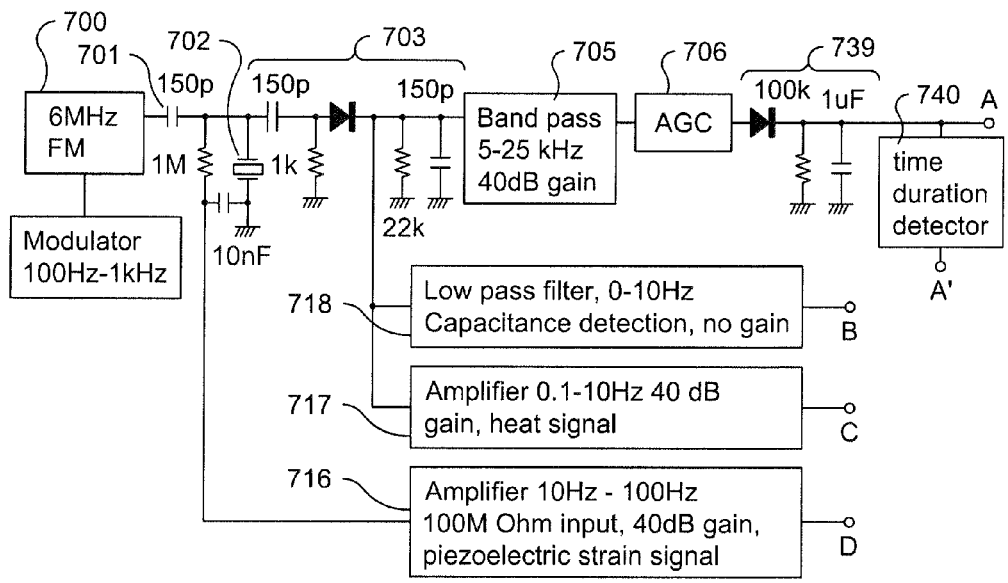
FIG. 7 shows a schematic diagram of an embodiment of a reflective ultrasonic touch detection circuit according to the invention.

The above described functionality may be realized by means of the exemplary circuit shown in FIGS. 1, 4, and 7. The frequency modulated (FM) oscillator generates an FM signal and current is fed to piezoelectric element through a series resistor. Because of the effect of the series resistor, the current in piezoelectric element is almost constant while the frequency varies. Impedance 20 of the piezoelectric element is capacitive and decreases with increasing frequency except at the step 21. The FM signal is converted to an amplitude modulated (AM) signal by the impedance variation of the piezoelectric element. The AM signal has an amplitude variation 22 corresponding to impedance variations 20 of impedance curve 20 (from FIG. 2), of which amplitude variation is detected by the peak detector, and converted to a low frequency signal of which the main component is a 1 kHz signal, but which also includes higher frequency components (in the 5 kHz-25 kHz range) as well as some very low frequency components (in the 2 Hz-10 Hz range). The composite signal (CS) is fed to a band-pass amplifier circuit by which low frequency components are removed and only peaks or faster variation signals 24 (FIG. 2) are selected. In the illustrated embodiment, the band pass amplifier includes automatic gain control (AGC) which adjusts the gain steadily to obtain a substantially constant output in the "no-touch" condition so that the threshold setting detects the small quick signal variation for a very slight touch and for which impedance variation 21 is only slightly reduced and reduction of pulse amplitude 24 is smaller. The response time of the gain control may be very slow (e.g. on the order of 5 minutes) so that reduced pulse output by finger touching is not increased by gain control (i.e. should yield a small output). The band-pass amplifier circuit may include additional components such as additional amplification (e.g. 20-40 dB amplifier) and additional bandpass filtering. It is to be understood that the filter-amplifier—filter—AGC sequence is exemplary, and that other such components and sequences may be utilized without departing from the scope of the present invention. Another advantage of the AGC is to decrease variability by making the system sensitivity more consistent or constant, since impedance variation 21 of the piezoelectric element is sensitive to temperature variation, and further due to differences in sensitivity from unit to unit.

Figure 2:
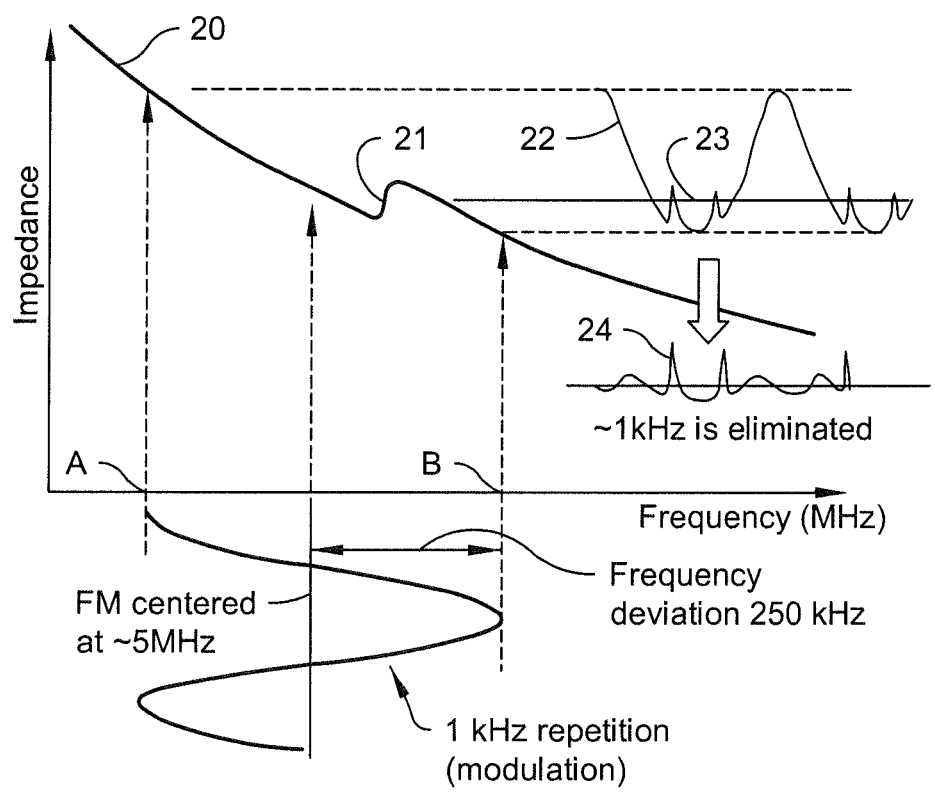
FIG. 2 illustrates the impedance variation of the piezoelectric element bonded at the back of a substrate, and further shows a frequency modulated signal used to detect impedance variation of the piezoelectric element at the back surface of the substrate according to an embodiment of the invention.
Figure 2A:
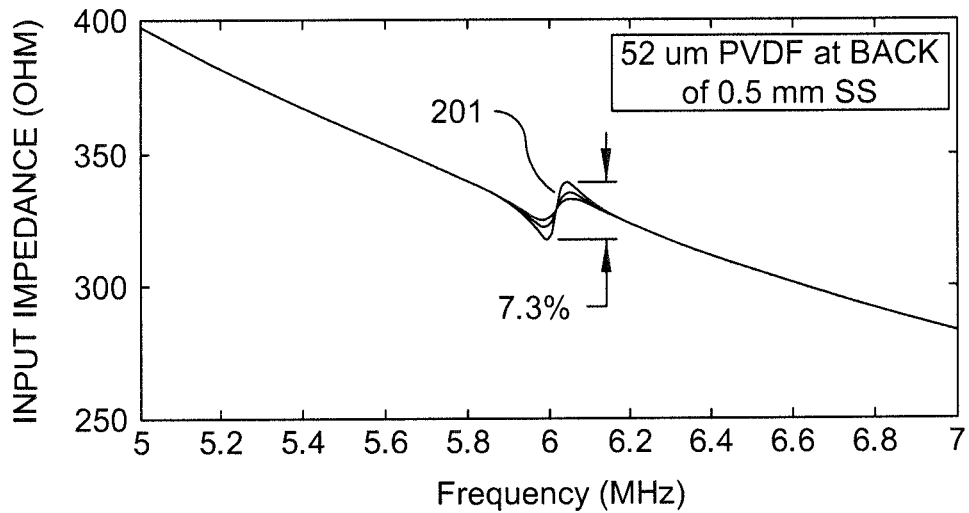
FIGS. 2a and 2b illustrate input impedance variations as a function of frequency for PVDF material elements of different thicknesses bonded at the back of a same substrate.
Figure 2B:
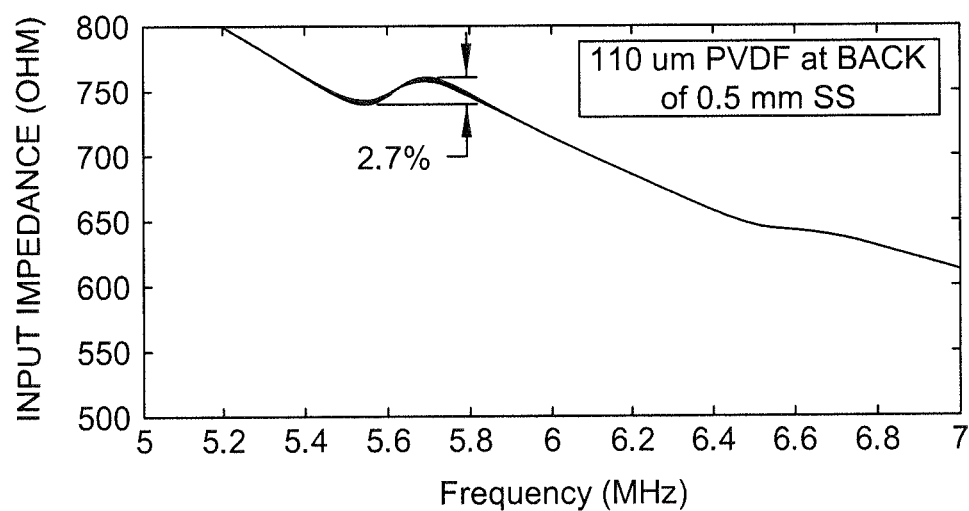

FIG. 2(*a*) and FIG. 2(*b*) show simulation results by use of Mason model of the frequency dependent impedance 200 of piezoelectric polymer element 102. FIG. 2*a* shows the results for an exemplary 52 um PVDF 9×8 mm$^2$ material. FIG. 2*b* shows the results for an exemplary 110 um PVDF 9×8 mm$^2$ material. Both materials are bonded at back surface 106 of substrate 101 (shown as 0.5 mm stainless steel). The 52 um thick PVDF has its own resonance at 10.4 MHz and the 110 um thick PVDF has resonance at 5.2 MHz. The impedance gradually decreases with increasing frequency but with an abrupt change or spike 201 of impedance of the PVDF material. The abrupt change of impedance becomes less in the case of finger touching. In a simulation curve, the acoustic impedance of the finger is assumed to be 0% (no touching or air), 20% and 40% of human skin impedance $1.5 \times 10^6$ kg/m$^2$sec. The 20% and 40% values were used due to the grooves of a finger print, which thereby makes partial contact with the target region. It should be noted that the resonance of the substrate and the resonance of the piezoelectric element are distinct resonances. Stainless steel has its own resonance at 5.8 MHz. If the two resonance frequencies (for piezoelectric element and substrate) are close in value to one another, then the effect of touching is small as shown in FIG. 2(b) and the peak is not significantly influenced by touching. If the two resonance frequencies are not close to one another, FIG. 2(a), the touching effect to the substrate resonance is strongly influenced by the finger, and is detected by piezoelectric element 102.

Figure 3A:
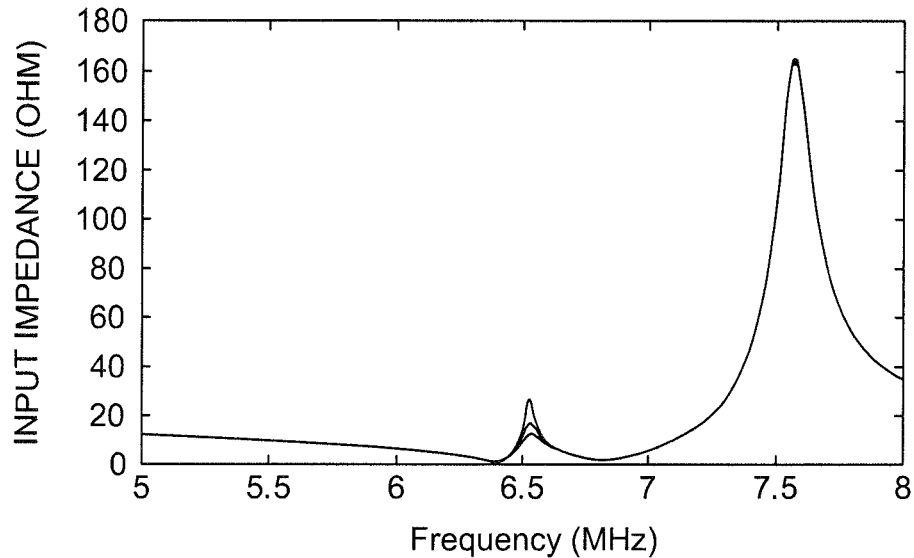
FIGS. 3a and 3b illustrate input impedance variations as a function of frequency for ceramic piezoelectric material elements of different thicknesses bonded at the back of a same substrate.
Figure 3B:
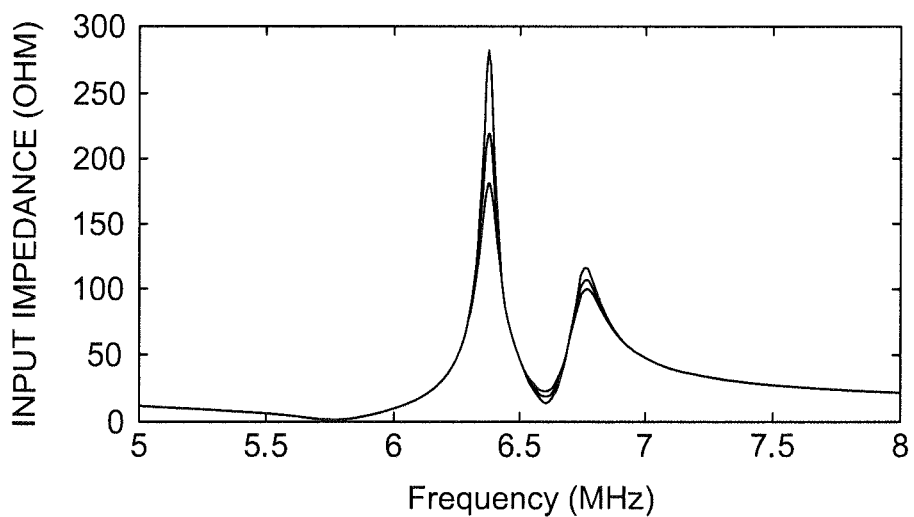

FIGS. 3(a) and 3(b) show simulation results of input impedance of ceramic piezoelectric element PZT5A with 300 um and 350 um thicknesses, respectively. The resonance of 300 um PZT is at 6.7 MHz, and that of the 350 um PZT is at 5.4 MHz. The resonance of the substrate 0.5 mm stainless steel is at 5.8 MHz, close to that of 350 um PZT. Abrupt change 301 shown in FIG. 3(a) is relatively smaller than the main peak 302 at 7.6 MHz. However, the effect of touching by the finger to the small peak at 6.5 MHz is observed there. On the other hand, for 350 um PZT, the peak at 6.4 MHz is very strong, but the effect of contact by a finger is relatively smaller than 52 um PVDF. Such effect of impedance variation is also used for the same sensor by slightly modified design of the circuit.

The gradual decrease of impedance of PVDF shown in FIG. 2(a) or 2(b) is due to the impedance of piezoelectric element 102 being mostly capacitance $C_P$ (the impedance of a capacitance $C_P$ is $1/\omega C_P$). Referring now to FIGS. 1 and 2 in conjunction with FIG. 4, the abrupt change of impedance 201 comes from resonance of substrate plate 101 (FIG. 1). When high frequency current is fed from voltage source 400 (FIG. 4) to piezoelectric element 102 ($C_P$) through coupling capacitor 401 ($C_C$), the voltage 405 on piezoelectric element 102 is determined only by the capacitance ratio of $C_C/C_P$, which does not change with frequency variation even though the impedance 200 varies with frequency, but an irregular change or spike corresponding to the abrupt change 201 remains the same. From such a design, voltage amplitude at 405 encounters sudden change at the substrate resonance 201.

Figure 5:
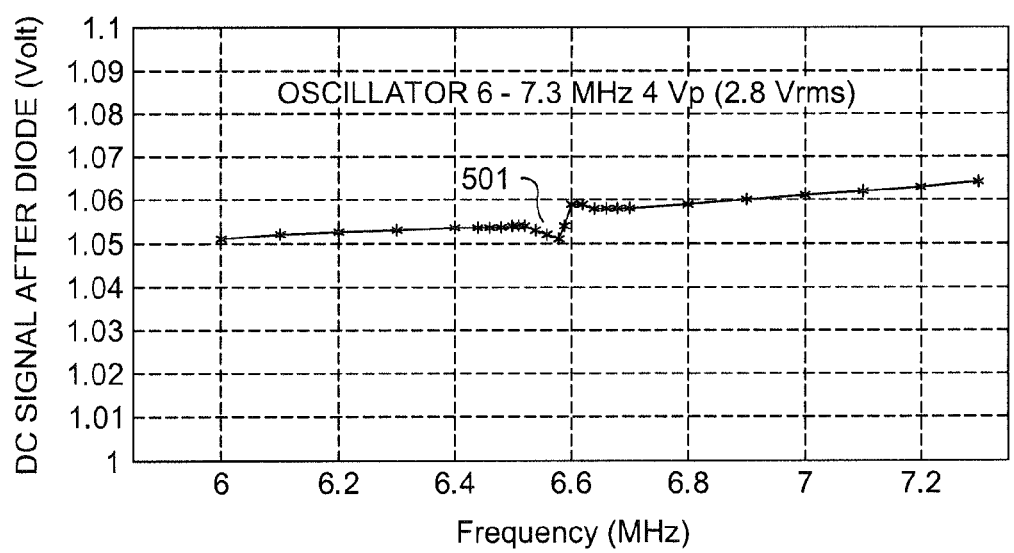
FIG. 5 illustrates measured data of the DC output from the peak detector of FIG. 4, and which exhibits a generally constant value over the frequency variation except for a singular irregular change or spike.

FIG. 5 illustrates measured data of the DC output from peak detector 413, which is mostly constant over the frequency variation of 6-7 MHz except for the irregular change or spike 501. The irregular change 501 becomes smaller (not shown in FIG. 5) when the front surface 105 is touched by a finger.

Figure 6A:
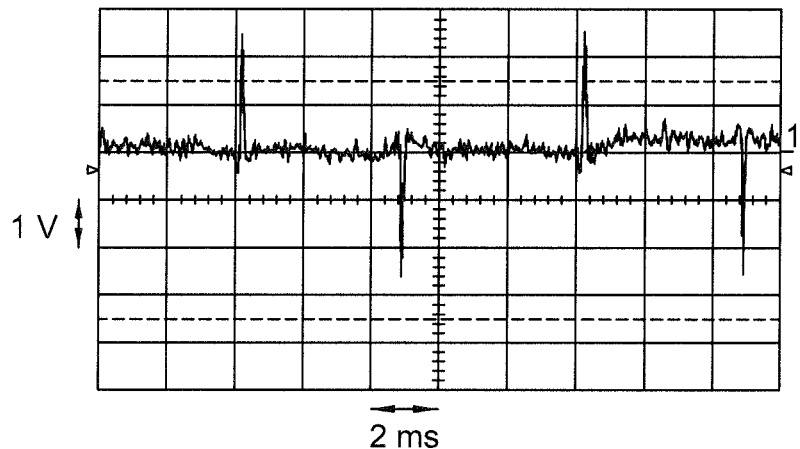
FIG. 6(a) shows an oscilloscope waveform of the DC output from the peak detector of FIG. 4 for 100 Hz modulation and pulse signals for a no finger touch condition according to an embodiment of the invention.
Figure 6B:
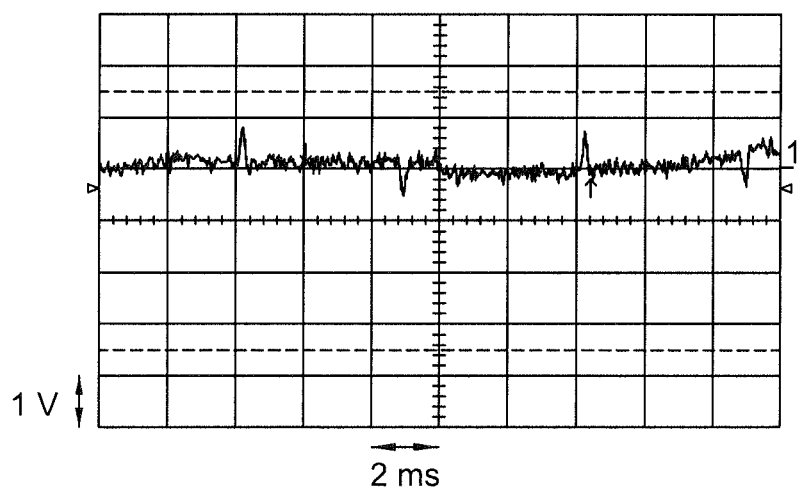
FIG. 6(b) shows an oscilloscope waveform of the DC output from the peak detector of FIG. 4 for 100 Hz modulation and pulse signals for a finger touch condition at the substrate according to an embodiment of the invention.

When frequency is scanned or in sinusoidal frequency variation with 100 Hz for example (this represents the FM signal with modulation at 100 Hz), the DC output from the peak detector 413 changes at the spike 501 and forms a pulse with repetition rate of 100 Hz. A positive or negative pulse is formed corresponding to the frequency increase or decrease at every half cycle. These pulses are shown in FIG. 6(a) for a no touching condition at the front surface of 0.5 mm stainless steel substrate 105. FIG. 6(b) shows the output when the finger touches on surface 105 and exhibits decreased pulse height.

Figure 6C:
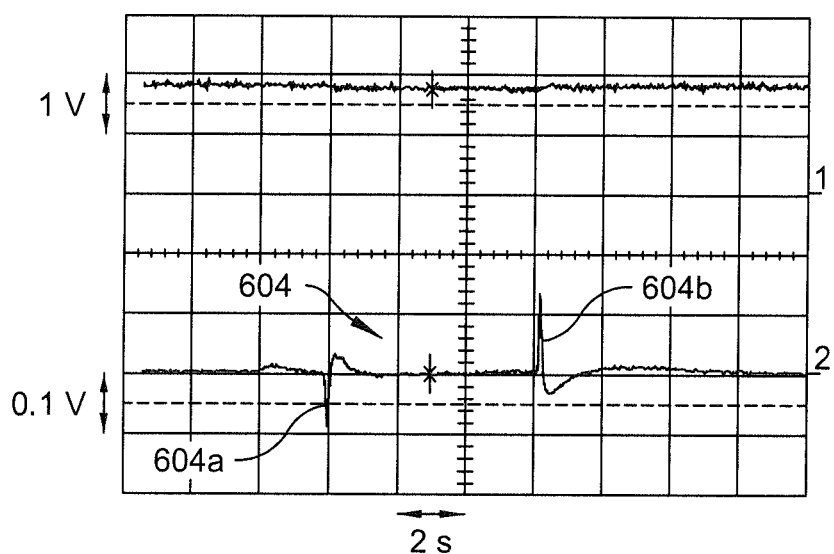
FIG. 6(c) shows oscilloscope waveforms of the DC output from the peak detector of FIG. 4 for 100 Hz modulation and pulse signals for a no signal condition, and for signals representing a finger depress and finger release condition, according to an embodiment of the invention.

FIG. 6(c) shows two oscilloscope waveforms. The upper trace shows a signal from terminal A when the device is in ultrasonic mode. When finger touched, a strong signal from terminal A is typically detected. However, in the case of the upper trace, depression occurred via pushing of a sharp object (e.g. tip of a driver). No signal results because a small point does not influence resonance of the substrate. The lower trace 604 represents a signal after bandpass filter 716 (pass low range of 10-100 Hz) resulting from the piezoelectric strain effect. Curve 604 illustrates the spikes 604a and 604b, where 604a represents a finger depression and 604b represents the finger release condition on the substrate, as a function of time.

The exemplary case of the high frequency is centered at 6.6 MHz and its frequency modulation at 100 Hz and frequency deviation amounts to +−250 kHz, and observed pulse is shown in FIG. 6(a). This is the case when nothing is touched at front face 105 of stainless steel. When front face is touched by finger 108, the pulse decreases as shown in FIG. 6(b).

The above described functionality may be realized by means of the exemplary circuit shown in FIG. 7. Referring to FIG. 7 in conjunction with FIGS. 1 and 4, the frequency modulated (FM) oscillator 700 generates an FM signal and current is fed to piezoelectric element 702 (e.g. PVDF film) through a coupling capacitor 701. The amplitude of FM signal at piezoelectric element 702 exhibits little change over frequency variation, except for the irregular spike illustrated as 21, 201 or 501 in FIGS. 2 and 5, respectively. This amplitude variation is detected by peak detector 703, and converted to a pulse signal with a repetition rate the same as the modulation signal. The output of the peak detector is fed to the band pass amplifier 705 with frequency range 5 kHz-25 kHz. The waveform is further reshaped to a filtered (more pure) pulse form by removing base fluctuations or noise components. In the illustrated embodiment, automatic gain control (AGC) 706 is provided after band pass amplifier 705, which adjusts the gain to obtain a substantially constant pulse height at the "non-touch" condition so that small signal for a very slight touch is detected by exceeding a given predetermined threshold condition. Another advantage of the AGC is to decrease variability by making the system sensitivity more consistent or constant, since impedance variation 201 of piezoelectric element 102 is sensitive to temperature variation, and further due to differences in sensitivity from unit to unit. The response time of the gain control is preferably designed to be very slow (e.g. on the order of minutes) so that reduction of pulse output signal by finger touching is not compensated by the AGC, but should yield an output. It is to be understood that the signal from band pass amplifier circuit 705 in FIG. 7 is represented as signal A. Further, the FM oscillator block 700 with coupling capacitor 701, piezoelectric element 702, peak detector 703 and band pass amplifier circuit 705 corresponds to the generator 111, piezoelectric element 102, peak detector 113, band pass amplifier 115, and decision circuit 117 shown in FIG. 1.

Referring still to FIG. 7, peak detector 739 is configured to detect the peak value of the pulse train from AGC 706, from which waveforms are shown in FIG. 6(a) (non touched) and FIG. 6(b) (touched). On the condition that the finger does not touch the surface 105, the output pulse height is relatively large and the large DC value is output from second peak detector 739. When the finger touches the surface 105, the output pulse height is low and a small DC value is output from 739.

In order to discriminate between finger touching and contamination (e.g. oil, butter, ketchup, water etc.) on surface 105, time duration detector 740 is used. As the effect of contamination exhibits a signal detection over a much longer time duration than that of a finger push (typically 0.1-0.5 sec), the time duration detector 740 compares the signal as a function of time to determine if the signal represents a finger push or detects contamination on the substrate and yields an output represented as signal A'.

Circuits 717 and 718 are configured to detect thermal energy (e.g. heat signal) by means of capacitance variation of piezoelectric element 702. The heat from a finger is relatively quickly transferred to piezoelectric element and the capacitance of piezoelectric element 702 varies due to temperature variation. This quick variation is amplified in circuit 717 (e.g. 40 dB) and passing filter function so that a finger touch may be detected in this manner. This signal is used as self diagnosis function. For example, piezoelectric element 102 may become delaminated from surface 105 but not completely detached or all off (i.e. still contacting 105) may yield an output signal even though there is no ultrasonic signal from terminal A. In addition, the problem of lower piezoelectricity of element 102 (e.g. due to excessive heat applied to the piezo material) ultrasonic signal from terminal A decreases (i.e. becomes very small)). However, the heat signal does not decrease by very much. Circuit 718 does not have gain and monitors the capacitance value to detect the signal from peak detector 703. Circuit 718 has a DC response for checking the steady variation of the signal at 703. In this way circuit 718 checks for normal functioning of oscillator 700, coupling capacitor 701, piezoelectric element 702, and peak detector 703.

By way of non-limiting example, detector circuit 116 shown in FIG. 1 may be implemented using band pass filters and amplifiers. More specific illustration is provided in FIG. 7 where there is shown an implementation depicted by circuit 716. As shown, the composite signal (CS) is fed to low pass circuit 716. In an exemplary embodiment, circuit 716 has a pass band range of 10-100 Hz so that the high frequency components of the composite signal are removed and only slowly varying signals are selected (e.g. signals in the spectrum range of 10-100 Hz). In the illustrated embodiment, the low pass amplifier circuit 716 includes signal amplification (e.g. 40 dB amplifier) and filtering components. The output from the piezoelectric element 702 due to pressure force from a finger is sensed through this circuit 716 and represented as output signal D. FIG. 6(*c*) shows, when the sensing area is pushed by end of sharp tool (such as driver), ultrasonic signal is not observed (upper trace) but piezoelectric strain signal is observed (lower trace).

Referring still to FIG. 7 in conjunction with the illustration depicted in FIG. 1, the output signals at each of the terminals A and D output from the respective circuits 705 and 716 (corresponding to elements 115 and 116 in FIG. 1) are applied to decision circuit 117 (FIG. 1). Signals A and D may be processed differently according to the requirements of a particular application. By way of non-limiting example only, for the implementation of a general touch pad for office equipment in a quiet room, at least one of signals A or D is fed to the decision circuit 117 which provides a signal to control switch 19. For applications or equipment which require security such as an ATM or bank related application, both signals of A and D are fed and compared in the decision circuit 117. In some environments with very strong vibration noise, such as heavy machinery, forklift trucks, or automobiles, signal A is enhanced and signal D is lowered by suitably adjusting the gain of circuits 705 and 716. For the case where surface contaminants are often contacting the sensing area, such as for use with kitchen appliances or machine tool workshops, signal A is lowered and signal D is enhanced by suitably adjusting the gain of circuits 705 and 716 (e.g. 117*a* of FIG. 8). For some cases, when giving a slight touch to a sensing area, the decision circuit 117 does not trigger an output because the sensed force is too small, and/or too slow in increasing the applied force (pressure), or a soft cloth may cover the finger, or heavy contamination may reside on the sensing face. In such cases, the cause of the non-signal output from decision circuit 117 may be identified from comparison of signals A and D (e.g. 117*b* of FIG. 8), and an alert or warning signal with an identifying reason may be provided via an audible signal and/or illuminating light from indicator controller 120.

Figure 8:
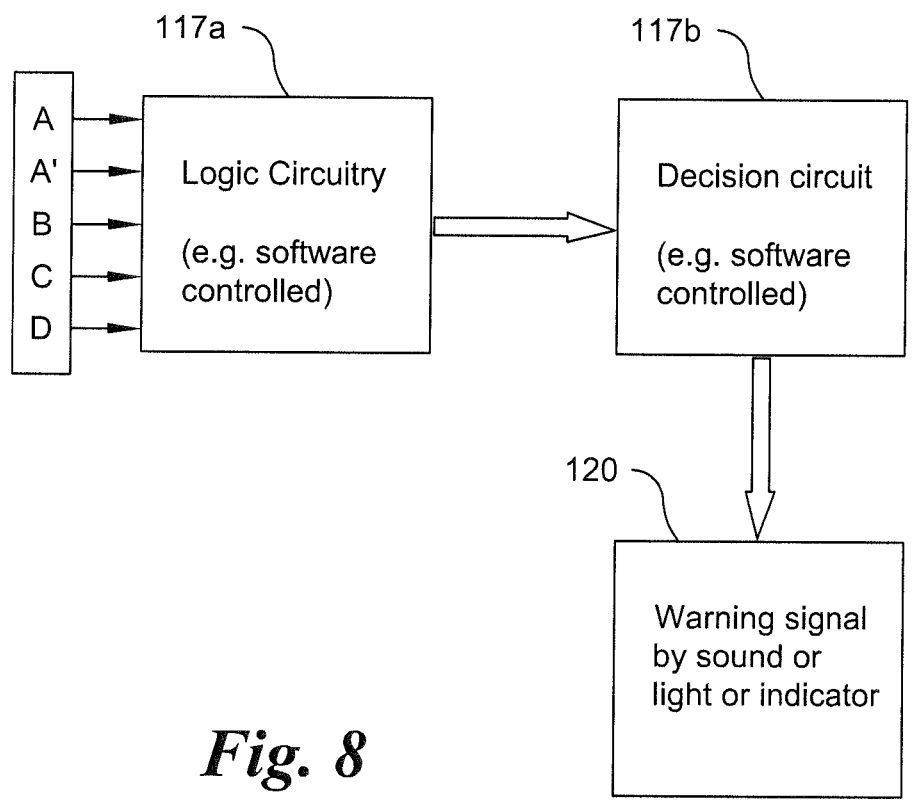
FIG. 8 shows a schematic diagram of exemplary processing and decision logic associated with the decision circuit of FIG. 1 for detecting and processing each of the signals A, B, C, D for execution according to embodiments of the present invention.

Decision circuit 117 further includes logic such as one or more AND logic circuits configured to provide output for a condition of existence of both signals A and D, OR logic circuits configured to provide output for a condition of existence of either of signal A or D (117*a* of FIG. 8). A programmed microprocessor is configured to determine the use of AND or OR circuits and in what fashion (e.g. both AND/OR mixed or either is enhanced by a certain degree) and make decisions based on the signal inputs (117*b* of FIG. 8). By way of non-limiting example, the system may be configured for an application often susceptible to high vibration conditions. Here the system logic may be configured to mitigate false activations (e.g. due to false detections based on signal D mistaking a sensed vibration for a finger touch). This may be mitigated by weighting the signal A output greater than that of signal D, and/or constructing logic that passes signal A output rather than D when discrepancies exist therebetween.

In another example, in applications where surface contamination is problematic, the circuit may mitigate against false detections output from circuit 705 (signal A) by weighting the signal A output less than that of signal D, and/or constructing logic that passes signal D output rather than A when discrepancies exist therebetween. Other logic configurations may be utilized, based on the particular conditions and environments for use.

Referring to FIGS. 8-9 in conjunction with FIGS. 1 and 7, there is shown exemplary processing and decision logic for detecting and processing each of the signals A, B, C, D for execution according to embodiments of the present invention. Processing associated with decision circuit 117 of FIG. 1 is shown schematically in FIGS. 8-9.

Depending on the particular application, failures may result from various different causes as shown in FIG. 9. Columns I-VI depict the signal from each of ports or terminals A, A', B, C, and D in FIG. 7 and their measured or determined features and conditions. Failure can be identified and used as self diagnosis and a warning signal provided as indicated. An exemplary implementation and processing logic scheme is described below with regard to FIG. 9:

Signal A: Processing is associated with the device in Ultrasonic mode. During finger touch the voltage is reduced (from the no touch condition).

Signal A': Processing includes checking the duration of the finger touch condition. If the duration is longer than a predetermined period (e.g. 10 sec), a determination is made that the surface is contaminated Signal B: Processing includes a capacitance check of the sensor element which may be performed by determining the voltage level on the sensor element, to detect failure or major temperature change.

Signal C: Processing includes determining the level of heat signal by determining capacitance change indicative of heat from a finger touch.

Signal D: Processing includes determining piezoelectric strain signal resulting from finger touch.

Determined causes of failure of the senor may include the following decisions/determinations:

Item I: Too much exposure to significant high temperature so that piezoelectricity of film (e.g. PVDF) is lowered by depoling.

Item II: Too much exposure to significant high temperature so that the length of piezoelectric film (e.g. PVDF)

contracts and piezoelectric film is totally or partially separated from the substrate (e.g. stainless steel or metal or glass, or delamination resulting from flawed production process).

Item III: Lead wire is disconnected by mechanical shock or corrosion by liquid or oxidation or other physical or chemical reason.

Item IV: Lead wires or electrodes on film are electrically shorted (various reasons).

Item V: Substrate (e.g. stainless steel or metal layer) is locally deformed at the sensor location. This may be indicative of tampering (e.g. by vandalism or accidental impact) so that strain distribution by touching is influenced (e.g. determined to be outside normal/threshold limits).

Thus, there has been disclosed a dual mode touch switch, combining ultrasonic touch switch and piezoelectric touch switch modes which detect finger touch at the surface of a substrate and with a piezoelectric element at the back surface.

When the device is in the ultrasonic mode, frequency deviation of the FM drive signal is wide enough to detect an abrupt change of impedance representing a frequency change so that a large tolerance of thickness of the substrate is ensured.

The impedance change including the abrupt change may be detected by a circuit that includes a converter for conversion from FM to AM and a peak detector that converts the AM signal to a low frequency signal having sharp pulses that correspond to abrupt impedance changes, and further including a high pass filter that selects only the sharp pulses.

The amplitudes of the sharp pulses are kept to a substantially constant value by an AGC so as to increase tolerance of sensitivity for different piezoelectric elements. In operation, the amplitudes of the sharp pulses are reduced by finger touch at the surface of the substrate and the detected signal controls switch of the appliance or equipment.

When the device is operated in the piezoelectric touch switch mode, the signal induced by planar expansion of the piezoelectric element due to pressure from a finger is extracted while operating in ultrasonic mode.

As shown, the system and method disclosed herein provides that signals from both the ultrasonic mode and the piezoelectric touch mode are used together to determine switch conditions, and/or either one may be enhanced and the other one reduced depending on the application.

There has also been disclosed a reflective mode ultrasonic switch device which detects finger touch at the surface of a substrate and with a piezoelectric element at the back surface. The tolerance of substrate thickness of this ultrasonic reflective touch switch device is improved by use of a wide range of frequency deviation of drive signal by filtering out the fundamental modulation frequency from the output signal and wherein only sharp pulses corresponding to abrupt impedance changes of the piezoelectric element are extracted and processed to indicate the presence or absence of a finger at the surface.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A device for dual mode operation of ultrasonic touch switch mode in combination with piezoelectric touch switch mode which detects a touch at a touch sensitive front surface of a substrate and having a piezoelectric element at a back surface, said device comprising a drive circuit coupled to said piezoelectric element for applying a frequency modulated drive signal thereto to detect resonance at the substrate, wherein said piezoelectric element is connected to a terminal end of a first capacitor at a first node, the first capacitor disposed between said drive circuit and said piezoelectric element; and wherein said piezoelectric element is connected at said first node to a terminal end of a second capacitor downstream of said first capacitor, and a detector arrangement electrically coupled to the piezoelectric element configured to detected and filter signals indicative of abrupt changes in impedance corresponding to a sensed ultrasonic mode signal indicative of a touch or no touch condition using said detected resonance, and a sensed piezo strain signal indicative of a touch or no touch condition, wherein said detector arrangement comprises:

a peak detector circuit for detecting amplitude variations of the frequency modulated signal from said piezoelectric element and generating a pulse signal having a repetition rate corresponding to the modulation signal;

a first communication path including a first band pass filter circuit responsive to the output of the peak detector circuit for detecting a high frequency signal pulse indicative of a sensed ultrasonic signal, and generating a first output signal indicative thereof; and a second communication path including a first low pass filter circuit resistively coupled to said first capacitor at said first node for detecting a low frequency signal indicative of a sensed strain of said piezoelectric element, and generating a second output signal indicative thereof.

2. The device of claim 1, wherein in the ultrasonic mode, frequency deviation of the frequency modulated (FM) drive signal is sufficiently wide to detect an abrupt change of impedance representing a frequency change, thereby ensuring a given tolerance of thickness of the substrate.

3. The device of claim 1, wherein the detector arrangement further comprises an acoustic gain controller (AGC) for maintaining amplitudes of the signal pulses to a substantially constant value to increase tolerance of sensitivity for different piezoelectric elements.

4. The device of claim 3, wherein the amplitudes of the signal pulses are reduced by finger touch at the surface of the substrate.

5. The device of claim 1, wherein the detector arrangement electrically coupled to the piezoelectric element is configured to detect the piezoelectric strain signal induced by planar expansion of the piezoelectric element due to pressure from a finger or stylus.

6. The device of claim 1, wherein signals from both the ultrasonic mode and the piezoelectric touch mode are output to a decision circuit which discriminates between noise and a detected touch condition, and provides an output to a switch controlling a state of an appliance.

7. The device of claim 1, further comprising a decision circuit for receiving at least the first and second output signals, the decision circuit including a processor for identifying a finger touch condition or no-touch condition according to the first and second output signals and weighting the first and second output signals based on one or more rules associated with operation of said device.

8. The device of claim 7, wherein the one or more rules associated with operation of said device include weighting based on one or more environmental conditions.

9. The device of claim 8, wherein the one or more environmental conditions includes one or more of: external vibration applied on said device; and a surface contamination material on said device substrate.

10. The device of claim 7, wherein the detector arrangement further comprises:
a third communication path including a second low pass filter circuit coupled to the output of the peak detector for detecting a low frequency signal lower than that of said first low pass circuit and indicative of thermal energy from a finger impinging upon the substrate, and generating a third output signal for receipt by said decision circuit.

11. The device of claim 10, wherein the detector arrangement further comprises:
a fourth communication path including a third low pass filter circuit coupled to the output of the peak detector for capacitively detecting a low frequency signal and providing a unity gain output signal indicative of a steady variation in the output of the peak detector for receipt by said decision circuit.

12. The device of claim 1, wherein the first low pass filter circuit has a passband of about 10 Hz to 100 Hz; and the first band pass filter circuit has a passband of about 5 KHz to 25 KHz.

13. The device of claim 1, further comprising a time duration detector for comparing the amplitude of the detected first output signal indicative of a sensed ultrasonic signal as a function of time with a threshold value to determine whether the detected first output signal is indicative of a touch detection or a false activation.

14. A device for dual mode operation of ultrasonic touch switch mode in combination with piezoelectric touch switch mode which detects a touch at the surface of a substrate, the device comprising:
a piezoelectric element positioned at a back surface of the substrate to be touched;
a drive circuit coupled to said piezoelectric element for applying a frequency modulated drive signal thereto to detect resonance at the substrate;
a first detector arrangement coupled to the piezoelectric element for converting the frequency modulated signal to detect amplitude variations and generate a first output signal indicative of a sensed touch or no touch condition according to changes in the detected amplitudes based on resonance at the substrate;
a second detector arrangement coupled to the piezoelectric element and configured to generate a second output signal indicative of a sensed strain on said piezoelectric element and representative of a sensed touch or no touch condition; and
a decision circuit including a processor responsive to the outputs of the first and second detector arrangements for identifying a touch condition or no-touch condition according to the amplitudes of the first and second detector output signals and weighting of the first and second detector output signals based on one or more rules associated with operation of said device.

15. The device of claim 14, wherein the first detector arrangement includes a peak detector and a band pass amplifier responsive to said peak detector for generating said first output signal representing a sensed touch or no touch condition according to changes in pulse amplitude and duration based on resonance at the substrate; and wherein the second detector arrangement includes a low pass amplifier for removing high frequency components for generating said second output signal representing a sensed touch or no touch condition based on detected strain of said piezoelectric element.

16. The device of claim 15, further comprising a low pass filter amplifier coupled to the output of the peak detector for detecting a low frequency signal indicative of thermal energy from a finger impinging upon the substrate, and generating a third output signal for receipt by said decision circuit.

17. The device of claim 14, further comprising a time duration detector for comparing the duration of the detected touch condition of the first output signal with a predetermined period and generating an output signal indicative of a false detection when said duration exceeds said predetermined period.

* * * * *